US007982179B2

(12) United States Patent
Adamec et al.

(10) Patent No.: US 7,982,179 B2
(45) Date of Patent: Jul. 19, 2011

(54) BEAM CURRENT CALIBRATION SYSTEM

(75) Inventors: Pavel Adamec, Haar (DE); Fang Zhou, Feldkirchen (DE)

(73) Assignee: ICT Intergrated Circuit Testing Gesellschaft für Halbeiterprüftechnik mbH, Heimstetten (DE)

( * ) Notice: Subject to any disclaimer, the term of this patent is extended or adjusted under 35 U.S.C. 154(b) by 283 days.

(21) Appl. No.: 12/366,465

(22) Filed: Feb. 5, 2009

(65) Prior Publication Data
US 2009/0200497 A1    Aug. 13, 2009

Related U.S. Application Data

(60) Provisional application No. 61/027,335, filed on Feb. 8, 2008.

(30) Foreign Application Priority Data

Feb. 8, 2008  (EP) ..................... 08101448

(51) Int. Cl.
*H01J 23/00*  (2006.01)
*G12B 13/00*  (2006.01)
(52) U.S. Cl. ..................... 250/252.1; 250/311
(58) Field of Classification Search ............... 250/252.1, 250/503.1
See application file for complete search history.

(56) References Cited

U.S. PATENT DOCUMENTS

| 3,842,271 | A | 10/1974 | Gee et al. |
| 6,545,277 | B1 * | 4/2003 | Kella et al. ............... 250/310 |
| 7,282,711 | B2 * | 10/2007 | Winkler et al. ............. 250/310 |
| 2001/0010362 | A1 | 8/2001 | Simizu |
| 2003/0020016 | A1 * | 1/2003 | Frosien ..................... 250/310 |
| 2003/0089853 | A1 * | 5/2003 | Kendall et al. ............. 250/311 |

FOREIGN PATENT DOCUMENTS

| EP | 0721202 A2 | 7/1996 |
| JP | 04-087244 A | 3/1992 |
| JP | 07-105888 A | 4/1995 |

* cited by examiner

*Primary Examiner* — Robert Kim
*Assistant Examiner* — David Smith
(74) *Attorney, Agent, or Firm* — Patterson & Sheridan, L.L.P.

(57) ABSTRACT

A charged particle beam device is described. The charged particle beam device includes an emitter adapted for emitting a primary charged particle beam, a specimen location adapted for holding a specimen, from which secondary and/or backscattered charged particles are released on impingement of the primary charged particle beam, a detection unit adapted for detecting the secondary particles and/or secondary particles, and a beam guiding unit adapted for guiding the primary charged particle beam to the detection unit for impingement of a primary charged particle beam on the detection unit.

23 Claims, 4 Drawing Sheets

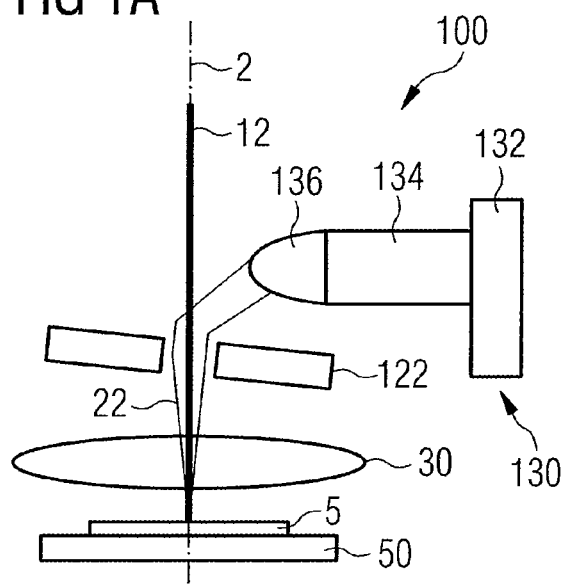
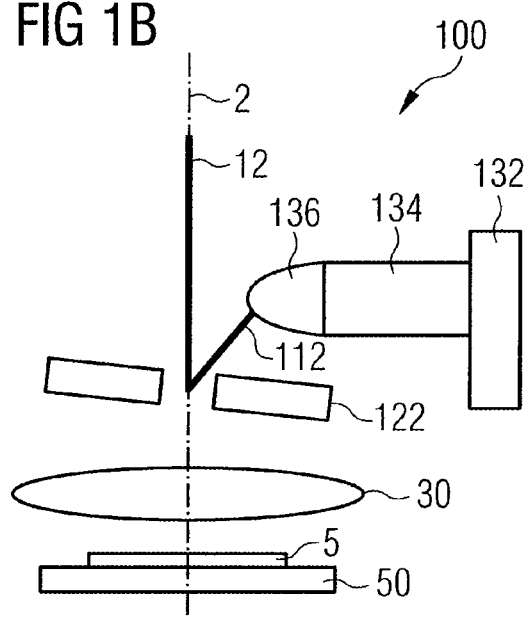
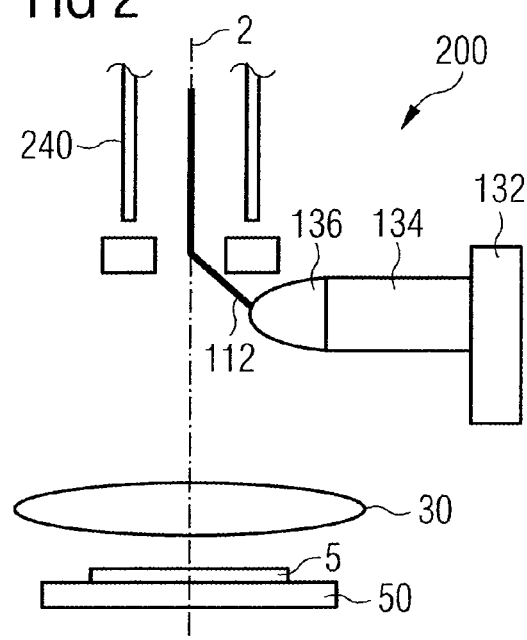

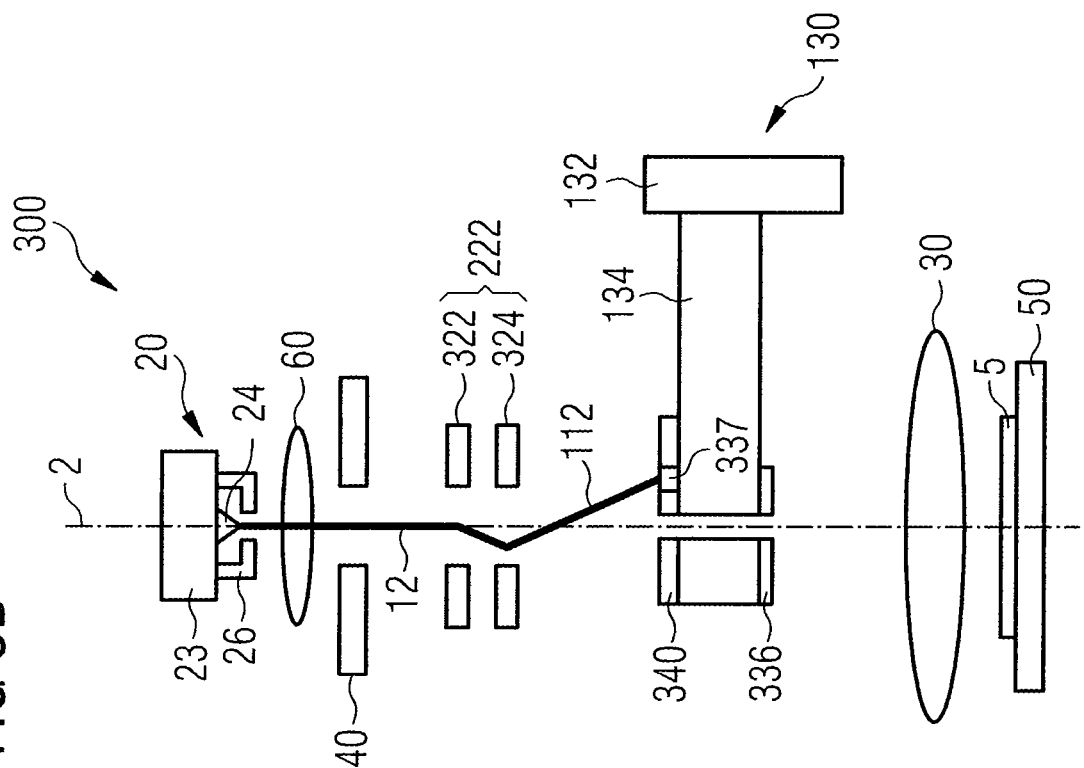
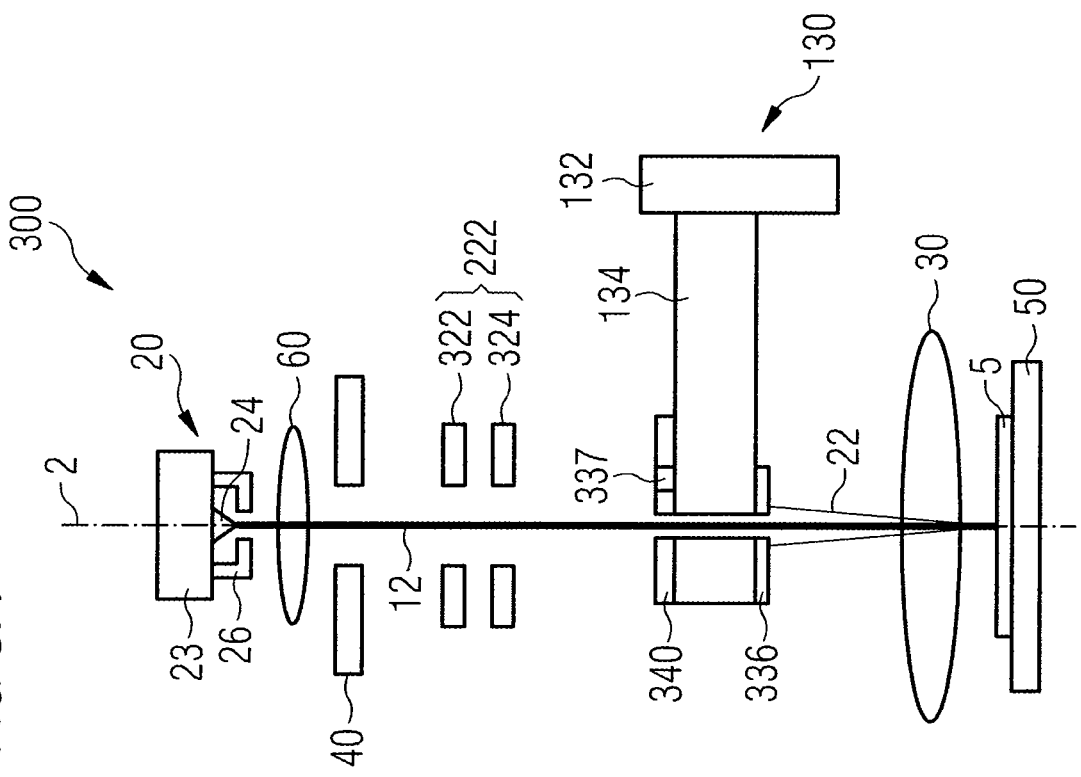

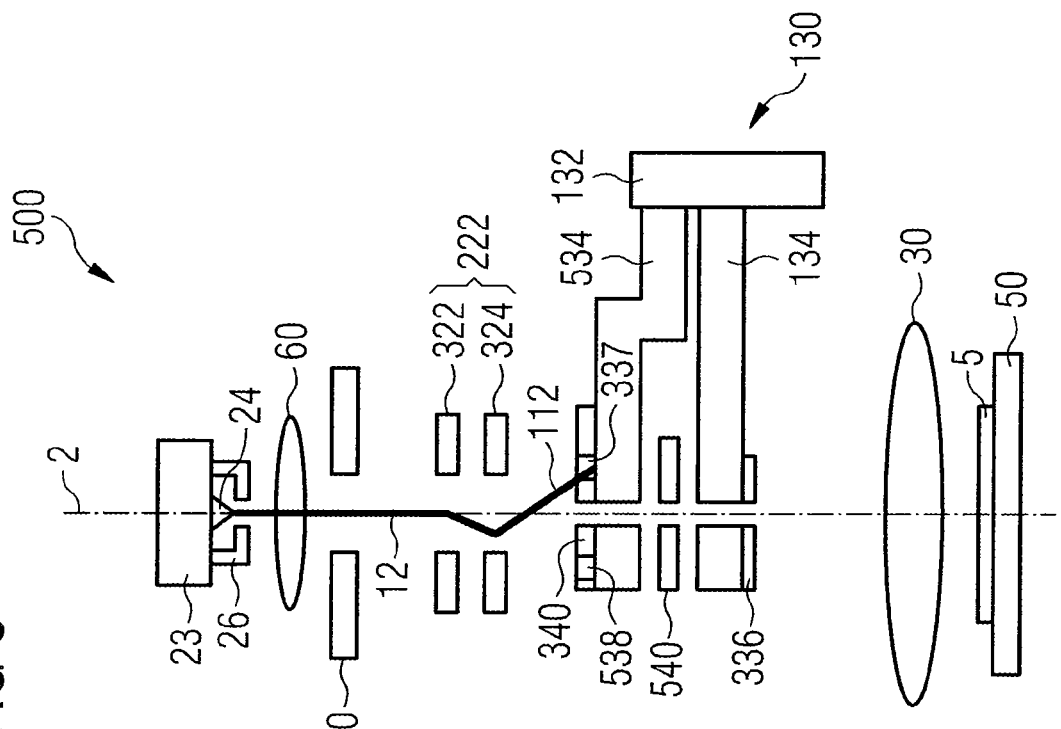
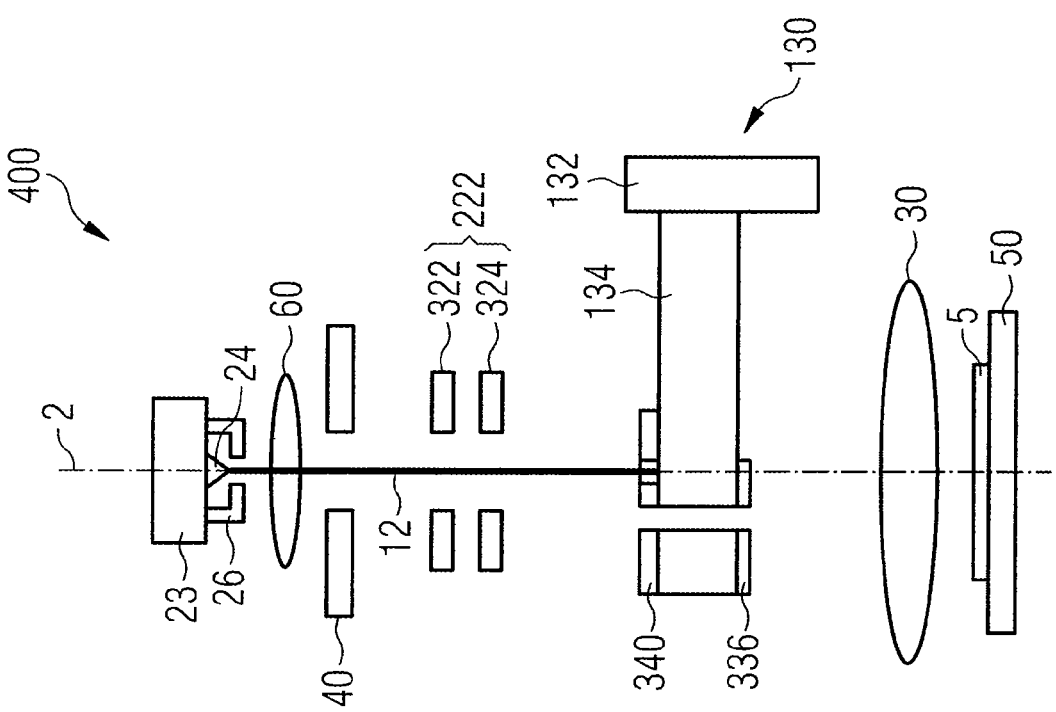

BEAM CURRENT CALIBRATION SYSTEM

FIELD OF THE INVENTION

The invention generally relates to a charged particle beam device and a method of operating a charged particle beam device. In particular, it relates to a charged particle beam device having elements for primary beam current measurement and a method for primary beam current measurement. Specifically, it relates to a charged particle beam device and a method of calibrating a beam current of a primary charged particle beam.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

Thereby, charged particle beam devices, in particular systems for accurate measurements like CD measurement systems in chip industry, EDX in material analysis, or the like, have a desire for a defined beam current. Furthermore, quantitative measurements require a stable beam current. Standard systems use a Faraday cup connected to an electrometer in order to measure the beam current on a regular basis. Thereby, during periodic maintenance, e.g., on a daily basis, the beam current is measured and readjusted to the required value. This process is time-consuming and unacceptable if the operation of the charged particle beam device should not be interrupted for a long time or if the beam current measurement should be conducted more frequently.

SUMMARY OF THE INVENTION

In light of the above, a charged particle beam device according to claims 1 and 3, and a method of measuring the beam current of a primary beam of a charged particle beam device according to claim 18 are provided.

According to one embodiment, a charged particle beam device is provided. The charged particle beam device includes an emitter adapted for emitting a primary charged particle beam, a specimen location adapted for holding a specimen, from which secondary and/or backscattered charged particles are released on impingement of the primary charged particle beam, a detection unit adapted for detecting the secondary particles and/or secondary particles, and a beam guiding unit adapted for guiding the primary charged particle beam to the detection unit for impingement of a primary charged particle beam on the detection unit.

According to another embodiment, a charged particle beam device is provided. The device includes an emitter adapted for emitting a primary charged particle beam, a specimen location adapted for holding a specimen, from which secondary and/or backscattered charged particles are released on impingement of the primary charged particle beam, a detection unit adapted for detecting the charged particle beam current, the detection unit including an scintillation element, and a beam guiding unit adapted for guiding the primary charged particle beam to the detection unit for impingement of a primary charged particle beam on the detection unit.

According to another embodiment, a method of measuring the beam current of a primary beam of a charged particle beam device, having an emitter for emitting a charged particle beam and a detection unit, is provided. The method includes directing a primary charged particle beam emitted from an emitter of the charged particle beam device on one of at least one scintillation element of the detection unit to generate a signal, and measuring the signal indicative of a primary charged particle beam current impinging on the one scintillation element.

Further advantages, features, aspects and details that can be combined with the above embodiments are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

Some of the above indicated and other more detailed aspects of the invention will be described in the following description and partially illustrated with reference to the figures. Therein:

FIGS. 1a and 1b show schematic views of a lower portion of a charged particle beam device according to embodiments described herein;

FIG. 2 shows schematic view of another charged particle beam device for improved beam current measurement according to the embodiments described herein; and FIGS. 3a and 3b show schematic views of a charged particle beam device according to embodiments described herein including a further scintillation element or scintillate for beam current measurement;

FIG. 4 shows a schematic view of a charged particle beam device according other embodiments described herein including a further scintillation element or scintillate for beam current measurement;

FIG. 5 shows a schematic view of an even further charged particle beam device according to even further embodiments described herein including a further scintillator for beam current measurement;

DETAILED DESCRIPTION OF THE DRAWINGS

Figure 6:
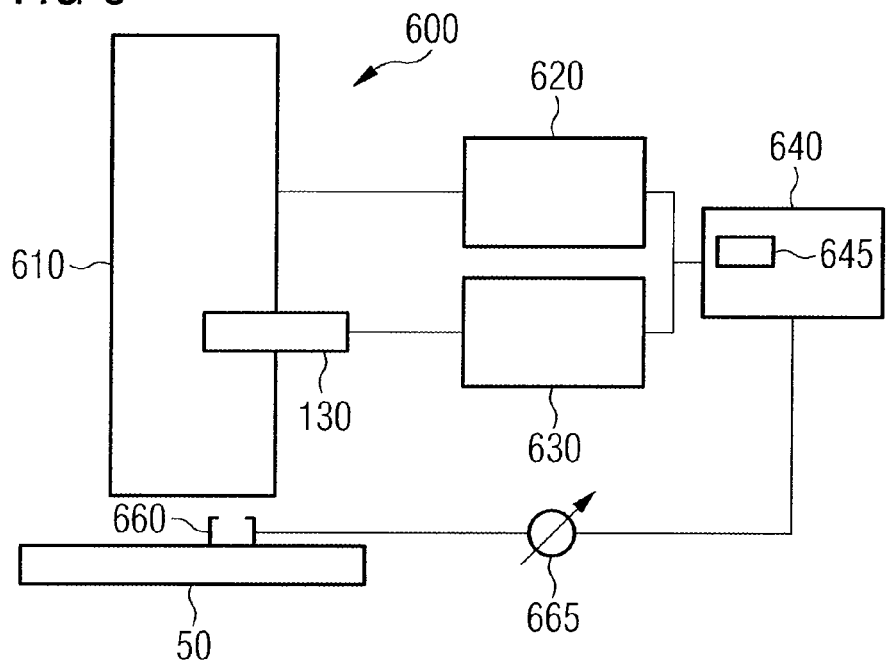
FIG. 6 shows a schematic view of a charged particle beam device connected to control means according to embodiments described herein.

Without limiting the scope of the present application, the charged particle beam device or components thereof will, in the following, exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image or to pattern a specimen.

Within the following description of the drawings, the same reference numbers refer to the same components. Generally, only the differences with respect to the individual embodiments are described.

FIGS. 1a and 1b illustrate some of the embodiments described herein. FIG. 1a shows a lower portion of a charged particle beam device 100, wherein a charged particle beam 12 is guided along optical axis 2 towards a specimen 5. On impingement of the primary charged particle beam 12, secondary and/or backscattered particles are released. The primary charged particle beam 12 is focused on specimen 5 by objective lens 30.

The secondary and/or backscattered particles 22, which are hereinafter referred to as secondary particles 22, travel through the objective lens 30 and are guided towards the detection unit 130. The detection unit 130 generates a signal on impingement of the secondary particles 22, which is used for image generation during normal operation of the charged particle beam device 100.

The detection unit 130 is, thus, adapted for detecting secondary and/or backscattered particles and includes a scintillator 136, a light guide 134, and a photomultiplier tube 132 or the like.

Within FIG. 1b the beam guiding unit 122, which is, according to one embodiment a deflection unit, is controlled to deflect the primary charged particle beam 12 towards the detection unit. Thereby, the beam current of deflected primary charged particle beam 112 can be measured.

Accordingly, it is possible to use the detection unit, which is adapted for detection of secondary particles 22 during normal (imaging) operation, for detection of the beam current of the primary charged particle beam 12. Thus, there is no necessity move a Faraday cup into the area of the primary charged particle beam. The deflection unit 122 can change to beam current measurement mode very fast. As a result, the beam current of the primary charged particle beam 12 can be measured frequently and within a limited time of about less than a few (3-4) seconds, e.g., 10 ms to 3 s.

According to some embodiments, the beam current measurement of the primary charged particle beam can, therefore, be conducted during changing of the specimen, during any periods during which the beam is usually blanked, e.g., 10 ms to 3 s, and during small non-imaging periods of less than about 5 s (e.g., change of specimen).

According to further embodiments, the beam current measurement of the primary charged particle beam with the detection unit adapted for measuring backscattered and/or secondary particles, can be typically applied for charged particle beam devices in which the primary charged particle beam is guided through the charged particle beam column on a beam boost potential of several keV or above. Generally, systems that provide the primary charged particle beam on beam boost potential include a tube (see, tube 240 in FIG. 2), which is on a high potential. Therefore, these systems generally feature a Faraday cup in the vicinity of the specimen support. Such a Faraday cup has to be moved in and out of the way of the measuring area. Thus, optionally, the embodiments described herein can be used even more beneficially for charged particle beam devices with beam boost units for the primary charged particle beam.

For example, in low voltage applications, the performance of standard charged particle beam devices can be increased considerably by using a so called beam boost. It accelerates the charged particles within the optical column of the microscope to high kinetic energy and decelerates them before hitting the specimen. The deceleration step is mostly carried out when the charged particles pass the objective lens. In general, the beam boost is achieved by surrounding the beam in the column with electrodes being shifted to a high accelerating potential.

FIG. 1b refers to embodiments including a deflection unit 122, which is provided between the detection unit 130 and the specimen 5 on specimen support 50. Thereby, the deflection unit 120 is provided by an electrode element including an opening for trespassing of the primary charged particle beam during imaging operation and which is connected to a voltage supply unit for biasing the electrode element. The electrode element is thereby adapted for reflecting or deflecting the primary charged particle beam 12 to the detection unit 130 and in particular to the scintillation element 136 of the detection unit.

Similarly to the detection of secondary charged particles the beam current of the primary charged particle beam can be detected as follows. The primary charged particle beam directed to the scintillation element 136 of the detection unit generates photons in the scintillation element. The photons are guided by light guide 134 to photo-multiplier tube 132 (PM). The PM 132 converts the photons into an electrical signal that corresponds to the current impinging on the scintillation element 136.

FIG. 2 shows a further embodiment of a charged particle beam device 200, in which the deflection unit is provided between a charged particle beam source and the detection unit 130. Thereby, electrostatic, magnetic or combined electrostatic-magnetic deflection units can be used to direct the primary charged particle beam 12/112 to the scintillation element 136 of the detection unit 130. Thereby, a electrical signal corresponding to the beam current of the primary charged particle beam can be generated by the PM 132. Switching between a imaging mode, which is, for example, shown in FIG. 1a, and for which the primary charged particle beam is guided onto the specimen 5, and a mode for which the primary charged particle beam is directed on the detection unit 130 adapted for detecting secondary and/or backscattered particles, can be conducted very fast. Thus, the beam current can be more often verified and/or adjusted.

According to further embodiments describe herein, the detection unit 130 can be a detection unit including a scintillation element 136 and a signal generation unit like a PM or a photodiode. In particular if a photodiode is provided, the detection unit is generally not adapted for measuring backscattered and/or secondary particles. Accordingly, a detection unit 130 (see, e.g., FIGS. 1A to 2) having a scintillation element can be provided for charged particle beam current measurements and a further detection unit for measuring the backscattered and/or secondary particles is provided.

The embodiments described herein might be employed to improve the current stability of many charge particle beam applications, in particular quantitative measurements in general, CD measurements and EDX measurements. Many applications call for an accuracy of the charged particle beam current of 1% or less. Thus, a frequent verification and/or adaptation of the beam current are desirable. The embodiments described herein can provide a fast and frequent beam current measurement. For example, according to some embodiments, a beam current measurement and a corresponding recalibration might be conducted in a range of every few minutes (e.g., every 3 to 10 minutes) to every few ten minutes (e.g., 30 to 60 min).

According to some embodiments, the primary beam current measurement elements, apparatuses and methods can be used for charged particle beam devices including a cold field emitter (CFE). Thereby, the beam current can experience an upward or downward jump in primary beam current of up to 10% after a flashing (cleaning) process. In order to be able to regularly compensate for these and other variations, the primary beam current can be measured regularly and compensated for by adjustment of the extractor voltage, the suppressor voltage or other methods.

FIGS. 3a and 3b illustrate further embodiments describing a charged particle beam device 300 in which a deflection unit adapted for secondary and/or backscattered particles is further adapted to measure the beam current of the primary charged particle beam. A charged particle beam 12 is emitted by a charged particle gun 20. The gun 20 includes an emitter 24 attached to a base 23 and a suppressor 26. The charged particle beam is essentially emitted along optical axis 2. Beam guiding and shaping means, like a condenser lens 60, an anode, and/or aperture 40, can be provided in the charged particle beam device for some embodiments. However, as will be apparent to a person skilled in the art, charged particle beam generation and guiding of the charged particle beam towards the specimen 5 during imaging of the specimen can be conducted in many ways, which are known to a person skilled in the art.

FIGS. 1a and 1b further show a high voltage electrode 340, which can be a part of the beam boost system of the charged particle beam device and which keeps the charged particle beam at a high potential in order to reduce the virtual beam path for electron-electron interaction, like the Boersch effect.

As shown in FIG. 3a, the primary charged particle beam 12 passes through an opening in the detection unit 12 and is focused on the specimen 5 on the specimen support 50 by objective lens 30. The secondary and/or backscattered particles 22 released thereby from the specimen trespass back through the objective lens 30. The secondary and/or backscattered particles impinge on the scintillation element 336. As mentioned above, the signal generation of the detection unit 130 includes photon generation in a scintillation element, guiding of the photons in a light guide and signal generation in the PM 132.

Generally, it is possible according to some embodiments that the primary charged particle beam 12 is decelerated by an appropriate potential of the specimen and the secondary and/or backscattered charged particles are accelerated away from the specimen 5 towards the detection unit.

According to some embodiments described herein, as illustrated in FIGS. 3a and 3b, the detection unit 132 includes a scintillation element 336, a light guide 132 and a photomultiplier tube 132. The detection unit 130 may, according to further embodiments, further include a further scintillation element 337. The further scintillation element 337 can be used to have the primary charged particle beam 12 deflected thereon, and thereby measure the beam current of the primary charged particle beam.

According to even further embodiments, the detection area, that is the scintillation area, for the primary charged particle beam can have a smaller size than the scintillation area of the scintillation element 336 for the secondary and/or backscattered particles. As an example an area about 1 mm$^2$ to 5 mm$^2$ can be used for having the primary charged particle beam impinge thereon.

According to other embodiments, the further scintillation element or scintillate 337 has a distance from the opening in the detection unit 1300 for trespassing of the primary charged particle beam in the range of 0.5 to 2 mm. Thereby, on the one hand, it can be assured that no signal is generated by the further scintillator during imaging of a specimen 5. On the other hand, it can be assured that no signal primary charged particle beam trespasses the opening during primary beam current measurement and generates a secondary charged particle signal, which might also mix up signals.

As shown in FIG. 3b a deflection unit 222, which may according to some embodiments include deflectors 322 and 344, can be used to direct the primary charged particle beam 12/112 to the further scintillation element 337. Thereby, the beam current of the primary charged particle beam can be measured at any time without the need for having a Faraday cup connected to an electrometer moved in the region of the primary charged particle beam.

According to further embodiments, the deflection unit may include electrostatic and/or magnetic deflection elements. According to even further embodiments, a storing element is provided to store the control values for the deflection unit for which the primary electron beam is guided through the opening in the detection unit 130 and/or the primary electron beam is guided on the scintillation unit for measuring the primary beam current. As will be described with respect to FIG. 5, further positions for primary charged particle beam positioning may be stored in the storing element. Typically, the control values can be voltages and/or currents which correspond to the desired deflection.

Generally, for the embodiments described herein, the photomultiplier tube, which can be generally considered an element for generation of an electrical signal, of the detection unit adapted for detection of the secondary and/or backscattered particles, can be used to generate a signal corresponding to the beam current of the primary charged particle beam.

According to embodiments described herein, the deflection of the primary charged particle beam can be conducted without adapting any of the high voltages, e.g., the high voltage electrode or other means for having the primary charged particle beam on a defined (high) potential, during beam current measurement. This can improve the stability of the system.

FIG. 4 illustrates further embodiments of a charged particle beam device 400. Thereby, FIG. 4 should be considered together with FIG. 3a described above. As compared to the imaging mode shown in FIG. 3a, FIG. 4 shows the detection unit 130 being moved towards the primary charged particle beam 12. By moving the detection unit 130, the primary charged particle beam 12 can either trespass the opening in the detection unit or can impinge on the further scintillator or scintillate 337, respectively. Thereby, further embodiments of the system shown in FIG. 3a can be yielded. The movement of the detection unit might, for example, also be applied if the charged particle beam device does not provide sufficient space to accommodate the deflection unit 222.

According to further embodiments, a charged particle beam device 500 as shown in FIG. 5 can be provided. Thereby, a first light guide 134 and a second light guide 534 are connected to the PM 132. The lower light guide 134 has the scintillation element or scintillate 136 attached thereto for detecting secondary and/or backscattered charged particles. The upper light guide has the further scintillation element 337 adjacent to the light guide for generation of a signal during beam current measurement.

According to further embodiments, a differential pumping aperture 540 is provided between the lower portion (134/336) and upper portion (534/337) of the detection unit 130. Accordingly, the embodiments described above with respect to FIG. 5 might be used for charged particle beam devices having a differential pressure pumping system, which might, for example, include different chambers of the charged particle beam column at different pressures.

According to further embodiments, which can be combined with any of the embodiments described above, further to the scintillation element 336 and the further scintillator 337, a third scintillate might be provided. Thereby, different scintillation areas with different sensitivities can be provided for the beam current detection of the primary charged particle beam. Thereby, for different beam current ranges a selection of the corresponding scintillation element or scintillate can be conducted electronically (see, e.g., FIG. 3) or mechanically (see, e.g., FIG. 4).

According to yet further embodiments, which can be combined with any of the embodiments described herein, scintillation elements, in particular for use of beam current measurement of the primary charged particle beam, can be deposited with a conducted layer such as an AL film or the like, to reduce charging of the beam current measurement area.

According to embodiments described herein, methods are provided such that the primary charged particle beam is directed on a detection surface, e.g., a scintillation element, of the detection unit which is used imaging.

According to different embodiments, the primary charged particle beam can be deflected or reflected towards a scintillator of the detection unit.

Further embodiments can include the calibration of the detection unit 130 on a regular basis. According to some embodiments, the signal obtained from the detection unit 122 is compared to a signal obtained by a Faraday cup (electrometer). Thereby, the detection unit signal can be calibrated to the value measured by the electrometer. Typically, different beam currents are generated during calibration, such that a calibration curve (e.g. linear) for the primary beam current as a function of the detection unit signal can be realized.

For example, the calibration can be conducted every 24 hours, during regular maintenance periods, or at other time intervals in order to avoid a drift of the beam current measurement. According to some embodiments, a control unit connected to the detection unit is provided. The control unit receives the electrical signal from the PM 132.

The control unit can be connectable to an electrometer measuring the primary beam current with a Faraday cup. Alternatively, if a calibration of the beam current measurement is conducted repeatedly, the control unit can be connected to a Faraday cup-electrometer-arrangement, which is provided in the charged particle beam device for regular calibration or re-calibration.

Further options, that might optionally be provided for the embodiments described herein, include a local averaging of the primary charged particle beam impingement on the scintillation element used for measuring the primary beam current. Thereby, the deflection unit 122 introduces a small movement of the primary charged particle beam over the scintillation element. Thereby, a potential influence of dark spots contaminated areas or other irregularities of the scintillation material can be reduced by a local averaging.

According to even further embodiments, the methods described herein include a time averaging of the measured beam current signal. Thereby, the beam current can be measured for at least 100 µs or a period in the range of 100 µs to 10 ms, typically, 100 µs to 500 µs. These periods for beam current measurements are, thus, longer than the regular signal integration time for a single pixel in an imaging mode. Generally, a signal integration time is adapted for measurement speed, whereas for one single measurement result, i.e., the beam current, a longer integration time can be chosen.

The measured beam current may be used to compensate for a fluctuation or jump in the primary charged particle beam current. For example, a jump or variation of the beam current might be introduced during flashing process of a cold field emitter (CFE). Compensation might be conducted using the extractor voltage, the suppressor voltage or other methods.

During operation adsorption and desorption of residual gas molecules might occur on the emitting surface of cold field electron emitters. These adsorptions and desorptions lead to continuously degraded and momentarily instable emission current respectively, so that the emitting surface has to be cleaned in regular intervals. Conventionally, this is done by a so-called "flashing" method. According to the flashing method, a heating current is supplied to the emitter so that the emitting surface heats up and the debris is removed from the surface According to further embodiments a "flashing" or cleaning of the emitter might include any of the following. A resulting change in primary beam current can be compensated for as described above by the primary beam current measurement and the desired countermeasures. For example, photons can desorb gas molecules from metal surfaces, particularly in vacuum. Therefore, the emitting surface of the emitter tip may be kept continuously clean by illuminating it with light. The photon source can, for example, be a laser. According to another embodiment of the present invention, the light source is a source of UV light, e.g. a UV laser. UV light has a higher energy and will directly excite the adsorbed atoms and/or molecules. Thus, UV light induces strong gas desorption while not heating the emitting surface. According to an even further embodiment, the light source is adapted for pulsed illumination of the emitting surface. Thus, in cases where the emission of photo electrons is very high or if the emitted photo electrons have an energy similar to the energy of the field-emitted electrons or if the light source emits high optical power, excess production of photo electrons, particularly within an energy range similar to the field-emitted electrons, or excess heating of the emitter can be prevented due to the pulsed operation of the light source.

FIG. 6 illustrates further embodiment of a charged particle beam device 600, which may be combined with any of the embodiments described herein. The charged particle beam device 600 includes a charged particle beam column 610. Further, a detection unit 130 is included. The controlled units 620 are connected to the charged particle beam column 610. For example, the control units 620 controls the beam guiding unit 122/222 (see FIG. 1a to FIG. 5). According to other embodiments, additionally, other elements in the charged particle beam column 610 might be controlled by the control unit 620.

The detection unit 130 is controlled by the control unit 630 for the detection unit. The control units, 620 and 630 respectively, are connected to the main control 640. As an example, the main control 640 includes a memory 645. The memory 645 can store the calibration of the detection unit 130, whereby the signal of the detection unit 130 can be correlated with a beam current of the primary charged particle beam. According to further embodiments, the memory 645 can be included in any of the other controls or the detection unit 130 itself.

The charged particle beam device 600 further includes a specimen support 50. Further, FIG. 6 shows a Faraday cup 660 and electrometer 665, which are connected to the main control 640. According to other embodiments, the Faraday cup 660 and the electrometer 665 may be connected to another control unit, for example the control units 630 for the detection unit.

During an imaging mode of the charged particle beam device 600 a specimen can be placed on the specimen support 50. The primary charged particle beam is guided onto a specimen and secondary and/or backscattered particles are detected by the detection unit 130. On a regular basis, the beam current of the primary charged particle beam can be measured by guiding the primary charged particle beam on a scintillation element of the detection unit 130. Thereby, a signal is generated. The signal generation may, for example, be generated in the control units 630 for the detection unit. According to different embodiments, the control units 630 may, therefore, include an amplifier, an A/D-converter or the like. The value for a primary beam current can thereby be gathered by a calibration that converts the signal of the detection unit 130 or the controlled unit 630 for the detection unit, respectively, into the beam current. According to embodiments described herein, the calibration can be stored in a memory 645.

These beam current measurements of the primary charged particle beam can be used to compensate for primary beam current fluctuations. As described above, compensation may be conducted by adjustment of an extractor voltage, an anode voltage, and suppressor voltage, an emitter tip voltage or the like.

According to further embodiments, which can be combined with other embodiments described herein, in order to assure that the beam current measurements of a primary charged particle beam with the detection unit 130 is correct, the calibration of the detection unit can be verified, that is, the calibration data in the memory 645 can be verified. Therefore, as shown in FIG. 6, a Faraday cup 660 connected to an electrometer 665 can be positioned in the charged particle beam device 600 to measure the primary beam current with the Faraday cup and the electrometer. The beam current values measured thereby are fed to the main control 640 or another controlled unit. Thereby, a new calibration of the detection unit can be generated and, for example, stored in the memory 645.

Figure 7:
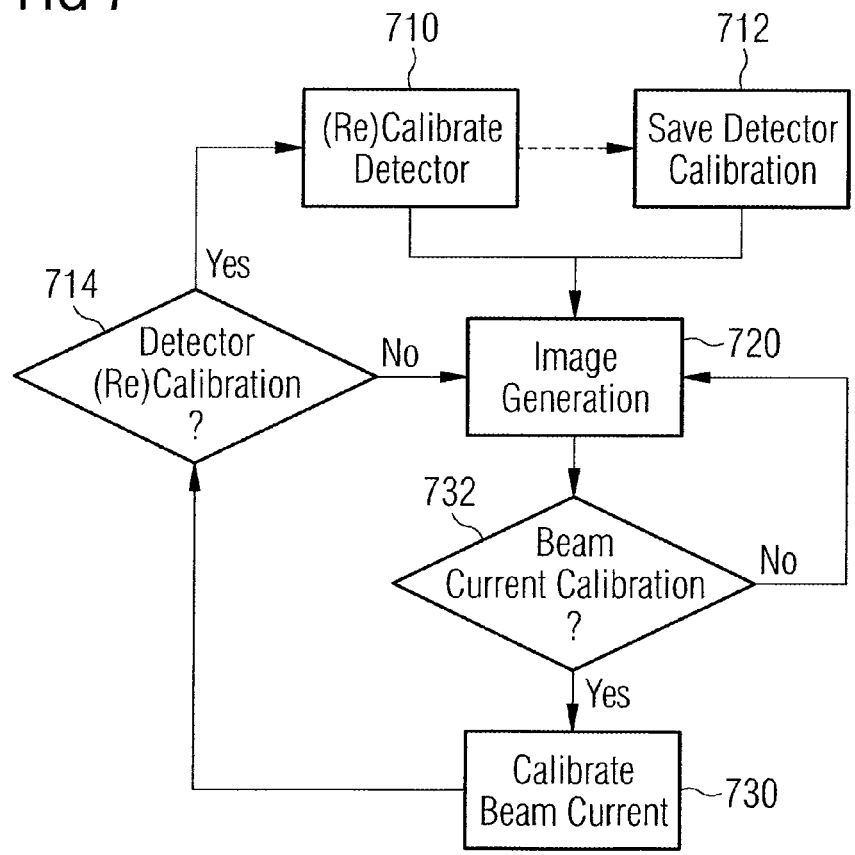
FIG. 7 illustrates different operation methods according to embodiments described herein.

Corresponding embodiments of methods are shown in FIG. 7. In step 710 the calibration for the detector is generated or provided to a charged particle beam device. According to some embodiments, the calibration of the detector can be generated by a comparison to a measurement with the Faraday cup as described above. According to other embodiments, the calibration may be generated externally and fed into the memory of the charged particle beam device. As indicated by the dashed arrow, a step of saving the detector calibration can optionally be included (712). According to yet other embodiments, a detector calibration can be directly saved in a memory of the charged particle beam device without any previous generation of calibration data within the present charged particle beam device. Within step 720 the charged particle beam device is used for image generation, whereby secondary and/or backscattered particles are detected by the detection unit. As long as the beam current of the primary charged particle beam does not require any calibration (step 732: no) image generation can be continued. If within step 732 it is decided that the beam current calibration is required (step 732: yes) the method proceeds to step 730, whereby the primary charged particle beam current is calibrated by guiding the primary charged particle beam on the detection unit of the charged particle beam device. According to some embodiments described herein, after step 730 it is decided whether or not a recalibration of the detector is required. According to other embodiments, the method proceeds after step 732 to step 720. In any case, if no recalibration of the detector is required, the charged particle beam device can further be operated by image generation (step 720). If in step 714 it is decided that a recalibration (or calibration) of the detector is required, the method proceeds to step 710. Within step 710 new calibration data for correlating the primary charged particle beam current with the signal of the detection unit is generated.

According to embodiments described herein, a charged particle beam device is provided. The device includes an emitter adapted for emitting a primary charged particle beam, a specimen location adapted for holding a specimen, from which secondary and/or backscattered charged particles are released on impingement of the primary charged particle beam, a detection unit adapted for detecting the secondary particles and/or secondary particles, and a beam guiding unit adapted for guiding the primary charged particle beam to the detection unit for impingement of a primary charged particle beam on the detection unit. According to further embodiments, it is optionally possible that the detection unit includes a photomultiplier tube, a light guide, and at least one scintillation element. According to yet further embodiments, which may be combined with any of the above mentioned embodiments, the beam guiding unit for the primary charged particle beam may further include a deflection element for deflecting the primary charged particle beam to the at least one scintillation element.

According to further embodiments, which might be combined with any of the embodiments described herein, an evaluation unit in communication with the photomultiplier tube is provided, wherein the evaluation unit is adapted for signal generated by the primary charged particle beam and for calibrating the beam current of the primary charged particle beam. Optionally, the evaluation unit can be connectable to an electrometer and a Faraday cage for providing calibration data to the evaluation unit.

Yet further embodiments are provided, wherein the deflection element can be provided between the objective lens and the detection unit or at the same height as the detection unit. Alternatively, the deflection element can be provided between the emitter and the detection unit or at the same height as the detection unit.

According to even further embodiments, which can be combined with any of the embodiments described herein, the at least one scintillation element includes two scintillation elements, wherein the first scintillation element is facing the specimen location and the second scintillation element is facing the emitter. Thereby, it is optionally possible that the detection unit further includes an opening for trespassing of the primary charged particle beam during impingement of the primary charged particle beam on the specimen. According to some embodiments, the second scintillation element can be at least 10 mm distant from the opening in the detection unit. According to even further embodiments, additionally or alternatively, the second scintillation element can have size with an impingement area of 1 to 5 mm$^2$.

According to some embodiments, the guiding unit can be provided by a condenser lens, an aperture and/or a deflection unit and the detection unit is moved to position the second scintillation element in the primary charged particle beam.

According to some embodiments, which can be combined with embodiments including at least two scintillation elements, the second scintillation element can be connected to a second light guide connected to the photomultiplier tube.

According to yet further embodiments the device can include at least a third scintillation element having a different sensitivity as compared to the first and/or the second scintillation element for measuring different primary beam current ranges.

According to embodiments described herein, a method of calibrating the beam current of a primary beam of a charged particle beam device having an emitter for emitting a charged particle beam and a detection unit for detecting secondary and/or backscattered particles is provided. The method includes directing a primary charged particle beam emitted from an emitter of the charged particle beam device on one of at least one scintillation element of the detection unit, and measuring a photomultiplier tube signal indicative of a primary charged particle beam current impinging on the one scintillation element.

Thereby, it is optionally possible that the directing of the primary charged particle beam on the at least one scintillation element includes deflecting the primary charged particle beam. Alternatively or additionally, the directing of the primary charged particle beam on the at least one scintillation element includes moving the at least one scintillation elements.

Embodiments described herein may further include calibrating the photomultiplier signal with an electrometer measurement.

According to yet further embodiments, the measuring of the photomultiplier signal is conducted at least every hour. As a further option, a calibration of the detection unit, e.g., the electrometer measurement, is conducted at time intervals of 24 hours of 12 hours or larger.

According to further embodiments, which can be yielded by a combination of any of the embodiments described herein, the charged particle beam device can be an electron beam device While the foregoing is directed to embodiments of the invention, other and further embodiments of the invention may be devised without departing from the basic scope thereof, and the scope thereof is determined by the claims that follow.

The invention claimed is:

1. A charged particle beam device, comprising:
   an emitter adapted for emitting a primary charged particle beam;
   a specimen location adapted for holding a specimen, from which secondary and/or backscattered charged particles are released on impingement of the primary charged particle beam;
   a detection unit adapted for detecting the secondary particles and/or backscattered particles in an imaging mode;
   a beam guiding unit adapted for guiding the primary charged particle beam to the detection unit for impingement of a primary charged particle beam on the detection unit in a non-imaging mode.

2. The charged particle beam device according to claim 1, wherein the detection unit further comprises:
   a photomultiplier tube;
   a light guide; and
   at least one scintillation element.

3. The charged particle beam device according to claim 2, wherein the beam guiding unit for the primary charged particle beam further comprises:
   a deflection element for deflecting the primary charged particle beam to the at least one scintillation element.

4. The charged particle beam device according to claim 1, wherein the detection unit further comprises an opening for trespassing of the primary charged particle beam during impingement of the primary charged particle beam on the specimen.

5. A charged particle beam device, comprising:
   an emitter adapted for emitting a primary charged particle beam;
   a specimen location adapted for holding a specimen, from which secondary and/or backscattered charged particles are released on impingement of the primary charged particle beam;
   a detection unit adapted for detecting the charged particle beam current, the detection unit including an scintillation element;
   a beam guiding unit adapted for guiding the primary charged particle beam to the detection unit for impingement of a primary charged particle beam on the detection unit, wherein the detection unit is further adapted for detecting the secondary particles and/or backscattered particles.

6. The charged particle beam device according to claim 5, wherein the detection unit further comprises a photo diode or a photomultiplier tube.

7. A charged particle beam device, further comprising:
   an emitter adapted for emitting a primary charged particle beam;
   a specimen location adapted for holding a specimen, from which secondary and/or backscattered charged particles are released on impingement of the primary charged particle beam;
   a detection unit adapted for detecting the secondary particles and/or backscattered particles, wherein the detection unit comprises:
   a photomultiplier tube;
   a light guide; and
   at least one scintillation element;
   a beam guiding unit adapted for guiding the primary charged particle beam to the detection unit for impingement of a primary charged particle beam on the detection unit; and
   an evaluation unit in communication with the photomultiplier tube, wherein the evaluation unit is adapted for signal generated by the primary charged particle beam and for calibrating the beam current of the primary charged particle beam.

8. The charged particle beam according to claim 7, wherein the evaluation unit is connectable to an electrometer and a Faraday cage for providing calibration data to the evaluation unit.

9. The charged particle beam device according to claim 3, wherein the deflection element is provided between the objective lens and the detection unit.

10. A charged particle beam device, comprising:
    an emitter adapted for emitting a primary charged particle beam;
    a specimen location adapted for holding a specimen, from which secondary and/or backscattered charged particles are released on impingement of the primary charged particle beam;
    a detection unit adapted for detecting the secondary particles and/or backscattered particles; and
    a beam guiding unit adapted for guiding the primary charged particle beam to the detection unit for impingement of a primary charged particle beam on the detection unit, wherein the beam guiding unit comprises a deflection element, and the deflection element is provided between the emitter and the detection unit.

11. A charged particle beam device claim 1, comprising:
    an emitter adapted for emitting a primary charged particle beam;
    a specimen location adapted for holding a specimen, from which secondary and/or backscattered charged particles are released on impingement of the primary charged particle beam;

a detection unit adapted for detecting the secondary particles and/or backscattered particles, wherein the detection unit comprises:
a photomultiplier tube;
a light guide; and
at least one scintillation element; and
a beam guiding unit adapted for guiding the primary charged particle beam to the detection unit for impingement of a primary charged particle beam on the detection unit, wherein the at least one scintillation element includes two scintillation elements, wherein the first scintillation element is facing the specimen location and the second scintillation element is facing the emitter.

12. The charged particle beam device according to claim 11, wherein the second scintillation element is at least 10 mm distance from the opening in the detection unit.

13. The charged particle beam device according to claim 11, wherein the second scintillation element has size with an impingement area of 1 to 5 mm$^2$.

14. The charged particle beam device according to any claim 11, wherein the detection unit is moved to position the second scintillation element in the primary charged particle beam.

15. The charged particle beam device according to claim 11, wherein the second scintillation element is connected to a second light guide connected to the photomultiplier tube.

16. The charged particle beam device according to any claim 11, further comprising:
at least a third scintillation element having a different sensitivity than the first and/or the second scintillation element for measuring different primary beam current ranges.

17. A method of measuring the beam current of a primary beam of a charged particle beam device having an emitter for emitting a charged particle beam and a detection unit, the method comprising:
directing a primary charged particle beam emitted from an emitter of the charged particle beam device on one of at least one scintillation element of the detection unit to generate a signal;
measuring the signal indicative of a primary charged particle beam current impinging on the one scintillation element, wherein the detection unit is adapted for detecting secondary and/or backscattered particles and the signal is a photomultiplier tube signal.

18. The method according to any claim 17, wherein the directing of the primary charged particle beam on the at least one scintillation element includes deflecting the primary charged particle beam.

19. The method according to claim 17, wherein the directing of the primary charged particle beam on the at least one scintillation element includes moving the one of the at least one scintillation elements.

20. The method according to claim 19, wherein the moving the at least one scintillation elements includes moving of the detection unit.

21. The method according to claim 17, wherein, further comprising:
calibrating the photomultiplier tube signal with an electrometer measurement.

22. The method according to claim 17, wherein the measuring of the photomultiplier tube signal is conducted at least every 10 min or at least every hour.

23. A method of calibrating the beam current of a primary beam of a charged particle beam device, the method comprising:
measuring the beam current of a primary beam of a charged particle beam device having an emitter for emitting a charged particle beam and a detection unit, comprising:
directing a primary charged particle beam emitted from an emitter of the charged particle beam device on one of at least one scintillation element of the detection unit to generate a signal;
measuring the signal indicative of a primary charged particle beam current impinging on the one scintillation element;
adjusting the charged particle beam current; and
guiding the primary charged particle beam onto the specimen; and
detecting secondary and/or backscattered charged particles being released on impingement of the primary charged particle beam onto the specimen by the detection unit.

* * * * *

UNITED STATES PATENT AND TRADEMARK OFFICE
CERTIFICATE OF CORRECTION

PATENT NO. : 7,982,179 B2  
APPLICATION NO. : 12/366465  
DATED : July 19, 2011  
INVENTOR(S) : Adamec et al.

It is certified that error appears in the above-identified patent and that said Letters Patent is hereby corrected as shown below:

On the title page item (73),

In the Assignee:

Please delete "Halbeiterprüftechnik" and insert --Halbleiterprüftechnik-- therefor;

In the Claims:

Column 12, Claim 7, Line 17, please delete "further";

Column 12, Claim 11, Line 61, please delete "claim 1".

Signed and Sealed this
Twenty-fifth Day of October, 2011

David J. Kappos
*Director of the United States Patent and Trademark Office*